United States Patent
Kuwabara et al.

(10) Patent No.: US 6,707,153 B2
(45) Date of Patent: Mar. 16, 2004

(54) SEMICONDUCTOR CHIP WITH PLURAL RESIN LAYERS ON A SURFACE THEREOF AND METHOD OF MANUFACTURING SAME

(75) Inventors: Keiji Kuwabara, Suwa (JP); Terunao Hanaoka, Suwa (JP); Haruki Ito, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 35 days.

(21) Appl. No.: 09/814,802

(22) Filed: Mar. 23, 2001

(65) Prior Publication Data

US 2002/0008320 A1 Jan. 24, 2002

(30) Foreign Application Priority Data

Mar. 23, 2000 (JP) .......................................... 2000-81999

(51) Int. Cl.[7] .............................................. H01L 23/48
(52) U.S. Cl. ...................... 257/738; 257/778; 438/108
(58) Field of Search ................................. 257/759, 737, 257/738, 747, 778, 781; 252/734; 438/108

(56) References Cited

U.S. PATENT DOCUMENTS

| 5,470,787 | A | * | 11/1995 | Greer ........................... 437/183 |
| 5,767,010 | A | * | 6/1998 | Mis et al. .................... 438/614 |
| 5,886,415 | A | * | 3/1999 | Akagawa ..................... 257/789 |
| 6,097,087 | A | * | 8/2000 | Farnworth et al. ........... 257/698 |
| 6,287,893 | B1 | * | 9/2001 | Elenius et al. ............... 438/108 |
| 6,313,532 | B1 | * | 11/2001 | Shimoishizaka et al. ..... 257/734 |
| 6,326,701 | B1 | * | 12/2001 | Shinogi et al. ............... 257/797 |
| 6,333,565 | B1 | * | 12/2001 | Hashimoto .................... 257/781 |
| 6,348,730 | B1 | * | 2/2002 | Yi et al. ....................... 257/737 |
| 6,373,131 | B1 | * | 4/2002 | Karnezos ..................... 257/712 |
| 6,380,620 | B1 | * | 4/2002 | Suminoe et al. ............. 257/706 |
| 6,388,335 | B1 | * | 5/2002 | Lam ............................. 257/778 |
| 6,389,689 | B2 | * | 5/2002 | Heo .............................. 29/840 |

FOREIGN PATENT DOCUMENTS

| JP | 58-93266 A | 6/1983 |
| JP | 8-264489 A | 10/1996 |
| JP | 10-335779 A | 12/1998 |
| JP | 11-220069 A | 8/1999 |
| JP | 2000-40773 A | 2/2000 |

* cited by examiner

Primary Examiner—Vinh P. Nguyen
Assistant Examiner—Lourdes Cruz
(74) Attorney, Agent, or Firm—Oliff & Berridge, PLC

(57) ABSTRACT

A method of manufacturing a semiconductor device comprising a step of forming a plurality of resin layers, an interconnect connected electrically to an electrode of each of a plurality of semiconductor elements, and an external terminal connected electrically to the interconnect, on an aggregate of semiconductor elements having an electrode, and a step of cutting the aggregate, wherein at least one resin layer among the plurality of resin layers is formed avoiding a cutting region of the aggregate.

20 Claims, 14 Drawing Sheets

SEMICONDUCTOR CHIP WITH PLURAL RESIN LAYERS ON A SURFACE THEREOF AND METHOD OF MANUFACTURING SAME

Japanese Patent Application No. 2000-81999, filed on Mar. 23, 2000, is hereby incorporated by reference in its entirety.

TECHNICAL FIELD

This invention relates to a semiconductor device and a method of manufacturing the semiconductor device, a circuit board, and electronic equipment.

BACKGROUND

For high-density mounting of semiconductor devices, bare chip mounting is ideal. However, quality assurance and handling of bare chips are difficult. In this connection, semiconductor devices to which CSP (Chip Scale/Size Package) has been applied are being developed.

In particular, in recent years, so-called wafer-level CSPs, which are manufactured at the wafer level, have been attracting attention. In a wafer-level CSP, multiple semiconductor elements having a resin layer and further interconnects are formed wafer by wafer, and then each wafer is cut up into these semiconductor elements to form semiconductor devices.

However, it has happened that the edges of semiconductor devices diced like suffer cracking, and consequently the resin layer detaches from its interface with the semiconductor element.

SUMMARY

A method of manufacturing a semiconductor device according to the present invention comprises the steps of:

forming a plurality of resin layers, an interconnect electrically connected to an electrode of each of a plurality of semiconductor elements, and an external terminal electrically connected to the interconnect, on an aggregate of semiconductor elements having an electrode; and cutting the aggregate, wherein at least one resin layer among the plurality of resin layers is formed avoiding a cutting region of the aggregate.

A semiconductor device according to one aspect of the present invention is manufactured by the above-described method.

A semiconductor device according to another aspect of the present invention comprises:

a semiconductor chip having an electrode;

an interconnect electrically connected to the electrode of the semiconductor chip;

an external terminal electrically connected to the interconnect; and a plurality of resin layers provided on a surface of the semiconductor chip on which the electrode is formed, wherein at least one resin layer among the plurality of the resin layers is disposed within the semiconductor chip.

Over a circuit board according to the present invention, the above semiconductor device is mounted.

Electronic equipment according to the present invention comprises the above semiconductor device.

DETAILED DESCRIPTION OF THE EMBODIMENTS

Figure 1:
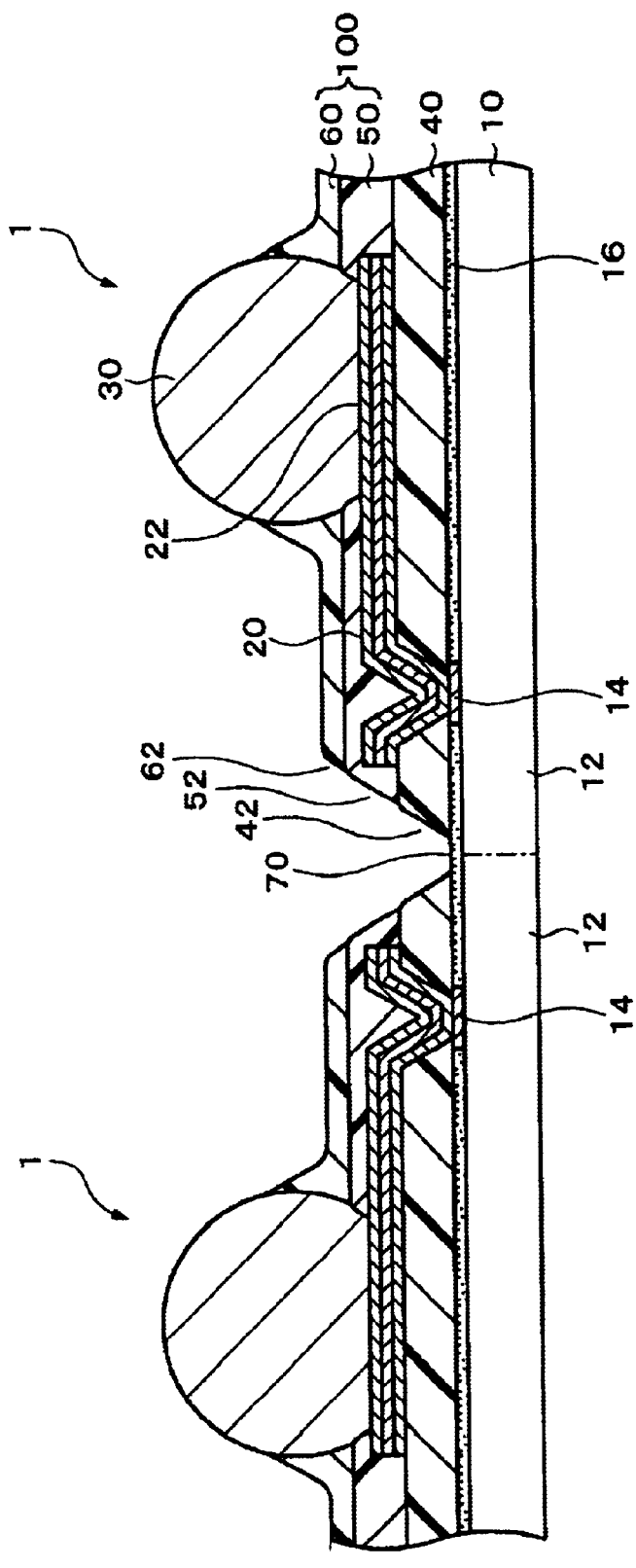
FIG. 1 is illustrative of a semiconductor device according to a first embodiment of the present invention.

By means of the embodiments of the present invention, it is possible to solve the problems discussed above and provide a highly reliable semiconductor device and a method of manufacturing the same, a circuit board, and electronic equipment.

(1) A method of manufacturing a semiconductor device according to the embodiments of the present invention comprises the steps of:

forming a plurality of resin layers, an interconnect electrically connected to an electrode of each of a plurality of semiconductor elements, and an external terminal electrically connected to the interconnect, on an aggregate of semiconductor elements having an electrode; and cutting the aggregate, wherein at least one resin layer among the plurality of resin layers is formed avoiding a cutting region of the aggregate.

According to the embodiments of the present invention, at least one resin layer is previously formed avoiding the cutting region in the aggregate, and then the aggregate is cut. As a result, cracking of the edge of the semiconductor device is reduced and detachment of the resin layers of the semiconductor device can be prevented. Accordingly, it is possible to manufacture a highly reliable semiconductor device.

(2) In this method of manufacturing a semiconductor device, the at least one resin layer may be formed by an ink jet method or a printing method.

This makes it possible to more simply form the at least one resin layer avoiding the cutting region.

(3) In this method of manufacturing a semiconductor device, the at least one resin layer may be formed by transferring a previously-formed pattern to the aggregate.

This makes it possible to more simply form the at least one resin layer avoiding the cutting region.

(4) In this method of manufacturing a semiconductor device, a material having a component which repels the at least one resin layer may be provided to the cutting region of the aggregate in order to form the at least one resin layer by repelling.

The at least one resin layer can be thus reliably removed from the cutting region.

(5) In this method of manufacturing a semiconductor device, the at least one resin layer may be formed of a light-sensitive material; and the at least one resin layer may be formed by removing part of the at least one resin layer disposed over the cutting region of the aggregate, by exposure.

This makes it possible to easily form the at least one resin layer by an existing process, for example.

(6) In this method of manufacturing a semiconductor device, the plurality of resin layers may include a first resin layer below the interconnect and a second resin layer above the interconnect; and at least the first resin layer may be formed avoiding the cutting region of the aggregate, in the step of forming the resin layers.

In this case, the first resin layer below the interconnect is formed avoiding the cutting region. This is effective when the first resin layer is formed relatively thick, for example.

(7) In this method of manufacturing a semiconductor device, the second resin layer may be formed avoiding the cutting region of the aggregate, in the step of forming the resin layers.

(8) In this method of manufacturing a semiconductor device, at least an uppermost layer in the second resin layer may be provided to cover the external terminal and the cutting region of the aggregate; and part of the uppermost layer disposed over the cutting region of the aggregate may be removed to expose at least a top portion of the external terminal, in the step of forming the resin layers.

This enables to remove the second resin layer from the cutting region by the existing number of steps, for example.

(9) In this method of manufacturing a semiconductor device, the second resin layer may be formed of a plurality of layers, and at least the uppermost layer in the second resin layer may be formed to cover the cutting region of the aggregate, in the step of forming the resin layers.

By means of this, occurrence of cracks in the edge of the semiconductor chip during the cutting and their growth can be reduced and detachment of the resin layer can be effectively prevented.

(10) In this method of manufacturing a semiconductor device, the plurality of resin layers may include a first resin layer below the interconnect and a second resin layer above the interconnect; and at least the second resin layer may be formed avoiding the cutting region of the aggregate, in the step of forming the resin layers.

In this case, the second resin layer above the interconnect is formed avoiding the cutting region. This is effective when the second resin layer is formed relatively thick, for example.

(11) In this method of manufacturing a semiconductor device, the thermal expansion coefficient of the second resin layer may be larger than the thermal expansion coefficient of the first resin layer.

Thermal stresses can be thus effectively relieved.

(12) In this method of manufacturing a semiconductor device, the second resin layer may be formed such that part of the external terminal exposed from the second resin layer is smaller than a contact portion of the external terminal connected to the interconnect, in the step of forming the resin layers.

The stress can be further relieved by increasing a contact area between the external terminal and the second resin layer.

(13) In this method of manufacturing a semiconductor device, the second resin layer may be formed of a plurality of layers;

the lowermost layer in the second resin layer may be formed avoiding part of the interconnect in which the external terminal is formed, in the step of forming the resin layers; and the external terminal may be formed on part of the interconnect exposed from the second resin layer, in the step of forming the external terminal.

The external terminal can be thus formed more simply.

(14) In this method of manufacturing a semiconductor device, each of the semiconductor elements may be provided with a plurality of electrodes; and the first resin layer may be formed on each of the semiconductor elements on the inside of the electrodes, in the step of forming the resin layers.

The first resin layer can be thus provide avoiding the cutting region. Moreover, by reducing the area of the first resin layer, the stress applied to the external terminal can be effectively relieved even when the thermal expansion coefficients of the semiconductor element and the first resin layer differ to some extent.

(15) A semiconductor device according to the embodiments of the present invention is manufactured by the above-described method.

(16) A semiconductor device according to the embodiments of the present invention comprises:

a semiconductor chip having an electrode;

an interconnect electrically connected to the electrode of the semiconductor chip;

an external terminal electrically connected to the interconnect; and a plurality of resin layers provided on a surface of the semiconductor chip on which the electrode is formed, wherein at least one resin layer among the plurality of the resin layers is disposed within an outline of the semiconductor chip.

According to this semiconductor device, the at least one resin layer is positioned within an outline of the cut semiconductor element. That is, at least one of the plurality of resin layers is formed avoiding the edge of the semiconductor element. This enables to prevent detachment of the resin layers from the cut surface.

(17) In this semiconductor device, the at least one resin layer may be formed below the interconnect.

(18) In this semiconductor device, the semiconductor chip may have a plurality of electrodes; and the at least one resin layer may be formed on the semiconductor chip on the inside of the electrodes.

Since the area of the resin layer is small, the stress applied to the external terminal can be effectively relieved even when the thermal expansion coefficients of the semiconductor chip and the resin layer differ to some extent.

(19) In this semiconductor device, the plurality of resin layers may include a resin layer provided on the interconnect to cover a bottom periphery of the external terminal; and part of the external terminal exposed from the resin layer may be smaller than another part of the external terminal connected to the interconnect.

By increasing a contact area between the resin layer and the external terminal, the stress can be further effectively relieved.

(20) Over a circuit board according to the embodiments of the present invention, the above-described semiconductor device is mounted.

(21) Electronic equipment according to the embodiments of the present invention comprises the above-described semiconductor device.

Embodiments of this invention will be described below with reference to the accompanying drawings. However, the invention is not limited to the following embodiments.

First Embodiment

FIG. 1 is illustrative of a semiconductor device according to a first embodiment of the invention. FIGS. 2 to 12 are views illustrating a semiconductor device manufacturing method according to this embodiment.

In a semiconductor device manufacturing method according to this embodiment, interconnects 20, external terminals 30 and a plurality of resin layers are formed on an aggregate 10. The aggregate 10 has multiple semiconductor elements 12. The aggregate 10 may be a silicon wafer. A plurality of electrodes 14 are formed on each of the semiconductor elements 12. By dicing the aggregate 10 into individual semiconductor elements 12, the semiconductor elements 12 can be made into semiconductor chips. FIG. 1, specifically, is a view showing an aggregate of semiconductor devices including the aggregate 10 before it is diced into individual semiconductor elements 12.

A semiconductor device according to this embodiment is obtained by cutting apart the semiconductor devices shown in FIG. 1. This semiconductor device 1 includes a semiconductor element (semiconductor chip) 12, interconnects 20, external terminals 30, and a plurality of resin layers (in FIG. 1, a first resin layer 40 and a second resin layer 100). At least one of the plurality of resin layers (in FIG. 1, both of the resin layers) is formed avoiding the edges of the semiconductor element 12. Because the package size of the semiconductor device 1 is substantially the same as the size of the semiconductor chip, it can be classified as a CSP, or it can be a flip chip having a stress-moderating function.

The plurality of electrodes 14 are formed on one surface (the active surface) of the semiconductor element 12. When the semiconductor element 12 is rectangular (square or oblong), the plurality of electrodes 14 are formed along at least one side (including two opposite sides or all the sides). Or, the electrodes 14 may be formed in the middle of one surface of the semiconductor element 12. A passivation film 16 of SiN, $SiO_2$, MgO or the like is formed on the semiconductor element 12, avoiding the electrodes 14. The passivation film 16 is an electrically insulating film. The passivation film 16, unlike the plurality of resin layers in this embodiment, may be made of a material other than resin. The passivation film 16 may be formed over the entire surface of the semiconductor element 12, avoiding the electrodes 14 at least partly.

An interconnect 20 is electrically connected to each of the electrodes 14 on the surface of the semiconductor element 12 on which the electrodes 14 are formed. The interconnect 20 is often made up of a plurality of layers. For example, the interconnect 20 can be formed by layering any of copper (Cu), chrome (Cr), titanium (Ti), nickel (Ni), titanium tungsten (TiW), gold (Au), aluminum (Al), nickel vanadium (NiV), and tungsten (W). When the electrodes 14 are formed at the edges of the semiconductor element 12, the interconnects 20 are led toward the center of the semiconductor element 12. As a result of an interconnect 20 being connected to each of the electrodes 14, an interconnect pattern is formed on the surface of the semiconductor element 12.

As shown in FIG. 1, an external terminal 30 is formed on each of the interconnects 20, avoiding the position directly above the electrode 14. Specifically, the external terminal 30 is formed on for example a land section 22 of the interconnect 20. The land section 22 is formed with a larger area than the part led out from the electrode 14 (the line). Because the external terminal 30 is formed avoiding the position directly above the electrode 14, stresses acting on the external terminal 30 do not act directly on the electrode 14. The external terminal 30 is for example a solder ball, and is used for electrically connecting the semiconductor device to a circuit board.

The first resin layer 40 may be formed in a plurality of layers, but in the example shown in FIG. 1 it is formed in one layer. The first resin layer 40 may have a stress-moderating function. The first resin layer 40 can be formed from polyimide resin, silicone-modified polyimide resin, epoxy resin, silicone-modified epoxy resin, benzocyclobutene (BCB), polybenzoxazole (PBO) or the like.

The first resin layer 40 is formed over a region including the area below the interconnect 20. Specifically, the first resin layer 40 is formed on the aggregate 10, and the land section 22 and the line connected thereto are formed on the first resin layer 40. In other words, the first resin layer 40 is formed at least between the interconnect 20 and the semiconductor element 12.

The second resin layer 100 is formed in one layer or a plurality of layers. The second resin layer 100 is formed over a region including the area above the interconnect 20. The second resin layer 100 may be made of the same material as the first resin layer 40, and at least one layer of it may have a stress-moderating function. Or, the second resin layer 100 may be made of a material different from that of the first resin layer 40.

In the example shown in FIG. 1, the second resin layer 100 includes an uppermost layer 60 and a lowermost layer 50. The uppermost layer 60 and the lowermost layer 50 may be made of different materials. As the material of the uppermost layer 60, preferably a material which can be used for the above-mentioned first resin layer 40 is used, and it is particularly desirable to use a material having a lower Young's modulus than the material of the first resin layer 40 and the other layers constituting the second resin layer 100 (the lowermost layer 50).

The interconnect 20 is connected at one part to the electrode 14 and from there is led to reach a position above the first resin layer 40. The land section 22 is formed on the first resin layer 40. The first resin layer 40 is formed on the aggregate 10, exposing the electrode 14. Specifically, the first resin layer 40 is formed on the passivation film 16 of the aggregate 10.

The lowermost layer 50 is for example solder resist and is formed so as to cover the interconnect 20. In this case, the lowermost layer 50 is formed avoiding the land section 22 of the interconnect 20. The lowermost layer 50 may also be formed on the first resin layer 40.

When the second resin layer 100 consists of one layer, the uppermost layer 60 may be formed so as to cover the interconnect 20 instead of the lowermost layer 50. The uppermost layer 60 is formed around the bottom of the external terminal 30. Alternatively, the uppermost layer 60 maybe formed so as to cover the sides of the external terminal 30, except a top portion of the external terminal 30. In either case, as a result of part of the uppermost layer 60 being removed, at least a top portion of the external terminal 30 is exposed.

The thermal expansion coefficient of the second resin layer 100 may be larger than that of the first resin layer 40. By this means, it is possible to relieve thermal stresses acting on the external terminal 30.

In a semiconductor device according to this embodiment, the first resin layer 40 is formed to be disposed within an outline of the semiconductor element 12. Specifically, the first resin layer 40 is formed avoiding the edges of the semiconductor element 12. In this case, as shown in FIG. 1, the second resin layer 100 may also be formed avoiding the edges of the semiconductor element 12. The edge surfaces of the first resin layer 40 and the second resin layer 100 of the semiconductor device 1 may be edges formed by an exposure technique, a printing method or an ink jet method or the like. These edge surfaces may be smooth edge surfaces different from mechanically cut edge surfaces or, as shown in FIG. 1, may be sloping surfaces forming a taper so that each of the resin layers becomes smaller as the distance from the semiconductor element 12 becomes larger.

When this is done, because the edge surfaces of the first resin layer 40 and the second resin layer 100 are positioned inside the periphery of the semiconductor device 1, their detachment from the semiconductor element 12 can be reduced.

And, in this embodiment, for example if the first resin layer 40 is formed avoiding the edges of the semiconductor element 12, the second resin layer 100 may be formed so as to cover the edges of the semiconductor element 12. That is, the cut surfaces of the second resin layer 100 may be positioned at the edges of the semiconductor device 1. In this case, just the uppermost layer 60 of the second resin layer 100 may be formed so as to cover the edges of the semi-conductor element 12. In particular, if the uppermost layer 60 is made using a material having a lower Young's modulus than the other resin layers (the first resin layer 40 and the lowermost layer 50 of the second resin layer 100), it is possible to reduce cracking of the semiconductor element 12 in the cutting region 70, reduce the progress of any cracking, and prevent detachment of the first resin layer 40 and the second resin layer 100 from the semiconductor element 12. Also, because the uppermost layer 60 does not have to be provided avoiding the edges of the semiconductor element 12, the semiconductor device can be manufactured by a simple process.

A method of manufacturing a semiconductor device according to this embodiment will now be described, with reference to FIGS. 2 to 12. In this embodiment, at least one resin layer among a plurality of resin layers (for example at least a first resin layer 40) is formed avoiding a cutting region 70.

As shown in FIGS. 2 to 5, a first resin layer 40, interconnects 20 and a lowermost layer 50, which is part of a second resin layer 100, are formed.

First, an aggregate 10 (see FIG. 8) having multiple electrodes 14 and having formed thereon a passivation film 16 avoiding the electrodes 14 at least partly is prepared.

Figure 2:
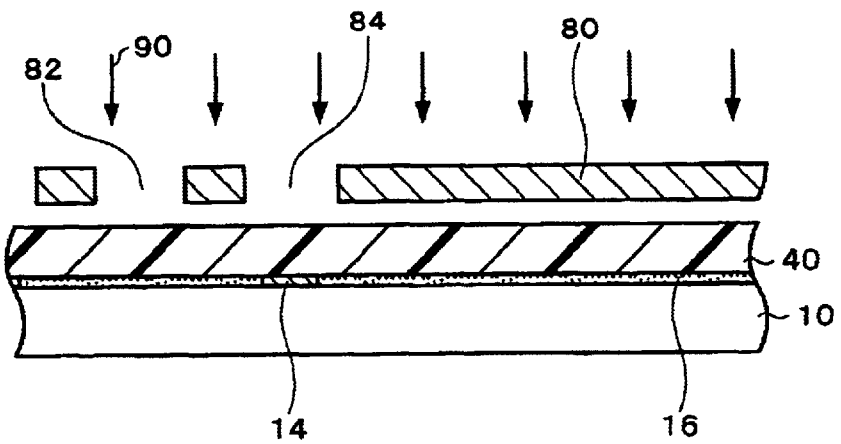
FIG. 2 is illustrative of a method of manufacturing a semiconductor device according to the first embodiment of the invention.

Then, a first resin layer 40 for forming interconnects 20 on is formed. The first resin layer 40 may be formed by an exposure technique. For example, as shown in FIG. 2, the first resin layer 40 is provided over the entire surface of the aggregate 10 (specifically, the passivation film 16) and the electrodes 14. As the material of the first resin layer 40, a resin whose properties change in response to energy (light, ultraviolet rays or radiation or the like), such as photopolymer, can be used, and it may be either one whose solubility increases (positive type) or one whose solubility decreases (negative type) when it is irradiated with energy.

Figure 3:
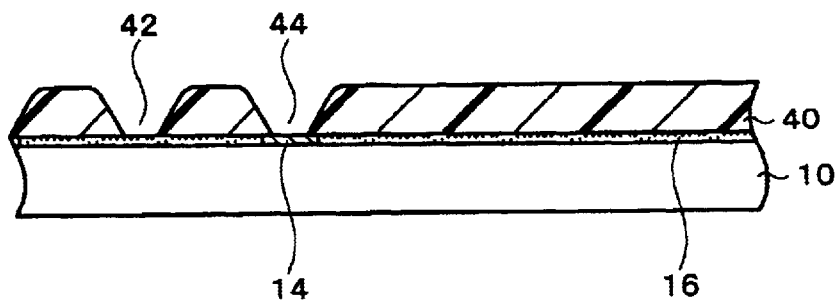
FIG. 3 is illustrative of a method of manufacturing a semiconductor device according to the first embodiment of the invention.

In the first resin layer 40, as shown in FIG. 3, holes 44 for exposing the electrodes 14 are formed, and an opening 42 is formed in the cutting region 70. The hole 44 is formed over each of the electrodes 14. The opening 42 is formed continuously along the cutting region 70 of the aggregate 10. In other words, the opening 42 is formed along the boundary lines between the adjacent semiconductor elements 12 of the aggregate 10.

For example, as shown in FIG. 2, a mask 80 with openings 82, 84 formed therein is disposed above the first resin layer 40 and energy 90 is radiated onto the first resin layer 40 through the mask 80. Here, as shown in FIG. 2, when the material of the first resin layer 40 is one whose solubility increases when it is irradiated with energy, the openings 82, 84 are disposed over the regions where the opening 42 and the holes 44 are to be formed. When on the other hand the material of the first resin layer 40 is one whose solubility decreases when it is irradiated with energy, the regions where the opening 42 and the holes 44 are to be formed are covered and openings are disposed over the other regions. By developing being carried out after that, as shown in FIG. 3, the opening 42 is formed below the opening 82 and the holes 44 exposing the electrodes 14 are formed below the openings 84. When this kind of energy irradiation technique (light exposure technique or the like) is applied, because energy gets around the openings 82, 84 of the mask 80, the opening edges of the opening 42 and the holes 44 are formed with curved surfaces.

Figure 4:
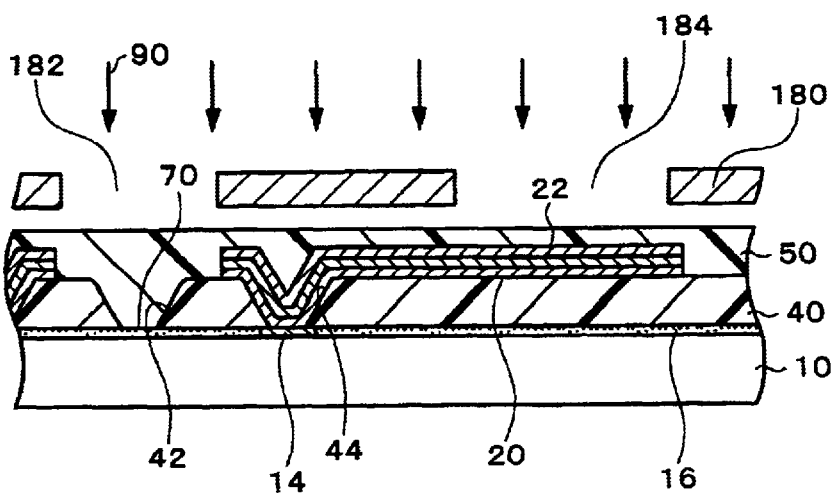
FIG. 4 is illustrative of a method of manufacturing a semiconductor device according to the first embodiment of the invention.

As shown in FIG. 4, an interconnect 20 is formed from each of the electrodes 14 on the first resin layer 40. The interconnect 20 may be formed by photolithography, sputtering or plating or the like. When a land section 22 is formed as part of the interconnect 20, the land section 22 is formed on the first resin layer 40. The interconnect 20 is formed also on the side surfaces of the holes 44 in the first resin layer 40.

By the interconnect 20 being led out from the electrode 14, it is possible for an external terminal 30 to be formed avoiding the position directly above the electrode 14. And, by this means, the external terminal 30 can be provided within the active region of the semiconductor element 12. That is, pitch conversion is possible. Accordingly, in the disposition of the external terminal 30, the inside of the active region, i.e. a region constituting a fixed surface, can be provided, and the freedom of the set position of the external terminal 30 increases. For example by making the interconnects 20 curve at required positions, external terminals 30 can be lined up in the form of a grid.

As shown in FIG. 4, a lowermost layer 50 is formed. For example, the lowermost layer 50 is provided over the entire surface of the first resin layer 40 and the interconnect 20. In this case, the opening 42 formed in the first resin layer 40 is also filled with the material of the lowermost layer 50. This step is preferably carried out after the first resin layer 40 is hardened.

Figure 5:
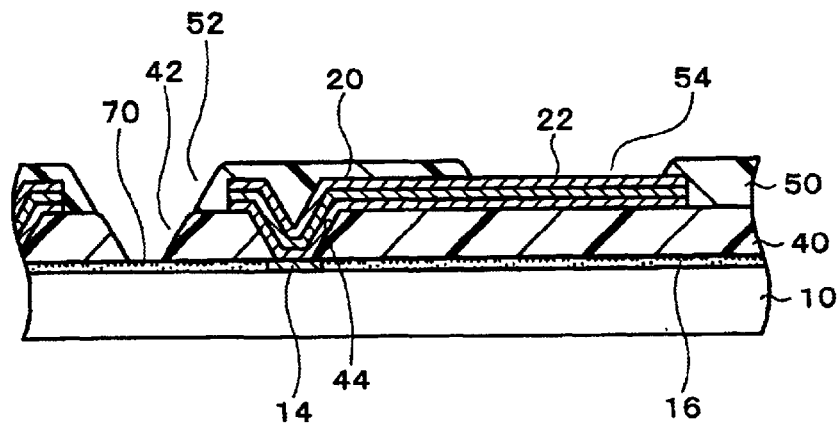
FIG. 5 is illustrative of a method of manufacturing a semiconductor device according to the first embodiment of the invention.

As shown in FIG. 5, to expose a part of the interconnect 20 (the land section 22) and form the lowermost layer 50 avoiding the cutting region 70, an opening 52 is formed in the lowermost layer 50. This may be carried out by the same method as the process used for the first resin layer 40. For example, as shown in FIG. 4, a mask 180 having openings 182, 184 formed therein is disposed above the lowermost layer 50 and energy is radiated onto the lowermost layer 50 through the mask 180. In this case, as shown in FIG. 4, when the material of the lowermost layer 50 is one whose solubility increases when it is irradiated with energy, the openings 182, 184 are disposed above the regions where the opening 52 and a hole 54 are to be formed. Alternatively, a material whose solubility decreases when it is irradiated with energy may be used as the material of the lowermost layer 50. By developing being carried out after that, as shown in FIG. 5, below the opening 182 the part of the lowermost layer 50 within the opening 42 is removed and the opening 52 is formed. And below each of the openings 184, the hole 54 exposing a part (the land section 22) of the interconnect 20 is formed. By means of the formation of the lowermost layer 50, a external terminal 30 can be provided simply in a later step. Alternatively, the step of forming the lowermost layer 50 may be omitted and an uppermost layer 60, discussed below, formed on the interconnects 20 instead.

Figure 6:
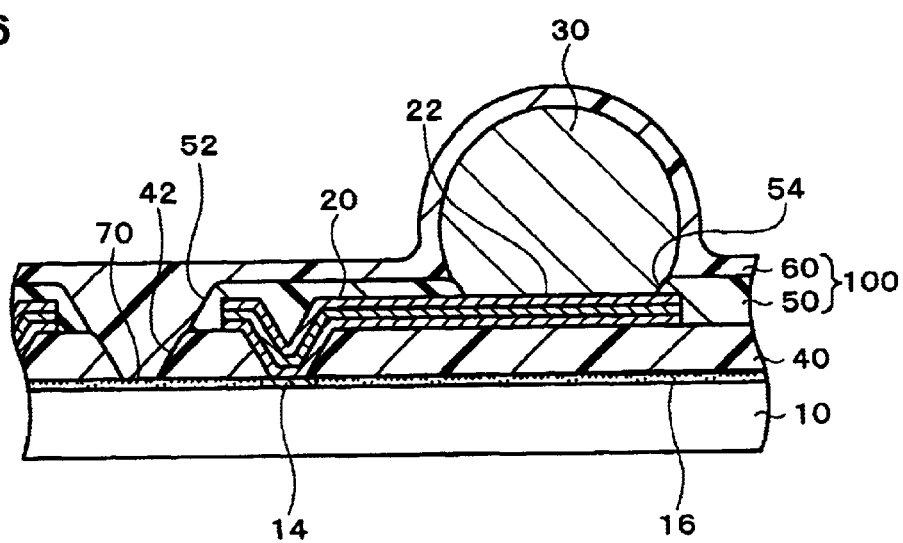
FIG. 6 is illustrative of a method of manufacturing a semiconductor device according to the first embodiment of the invention.
Figure 7:
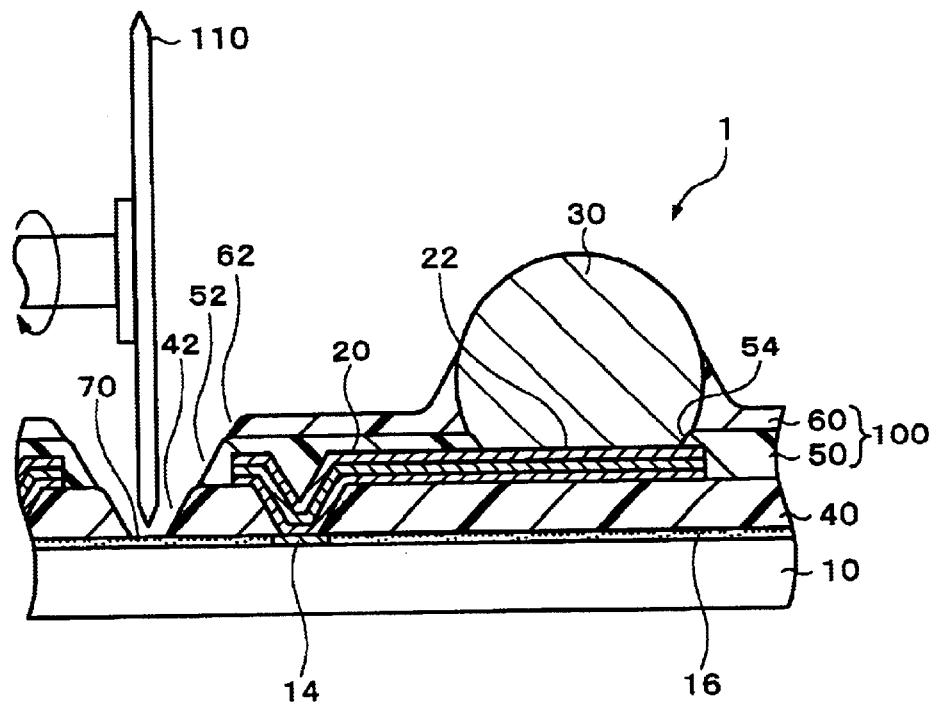
FIG. 7 is illustrative of a method of manufacturing a semiconductor device according to the first embodiment of the invention.

As shown in FIG. 6 and FIG. 7, external terminals 30 and the uppermost layer 60 are formed. Each of the external terminals 30 is formed on the interconnect 20. Specifically, the external terminal 30 is formed on a part (the land section 22) of the interconnect 20 formed on the first resin layer 40. When the lowermost layer 50 was formed, the external terminal 30 is provided on a part (the land section 22) of the interconnect 20 exposed by the lowermost layer 50. By forming the lowermost layer 50, the external terminal 30 can be provided easily. By positioning the external terminal 30 above the first resin layer 40, it is possible to relieve stresses acting on the external terminal 30 using the first resin layer 40 as a stress-moderating layer. The external terminal 30 may be formed by providing a solder ball on the land section 22. Or, solder cream may be provided on the land section 22 and this then melted and made into a ball by surface tension.

As shown in FIG. 6, the uppermost layer 60 is formed. The uppermost layer 60 is formed so that at least a top portion of the external terminal 30 is exposed. The uppermost layer 60 may be provided at least around the bottom of the external terminal 30. By this means, with the uppermost layer 60 as a stress-moderating layer, it is possible to relieve stresses (thermal stresses) acting on the external terminal 30.

For example, the uppermost layer 60 made from a nonlight-sensitive resin is provided over the entire surface of the lowermost layer 50 and the external terminal 30. In this case, the openings 42, 52 are also filled with the material of the uppermost layer 60. After that, by dry etching using a plasma or the like, part of the uppermost layer 60 is physically removed to expose at least a top portion of the external terminal 30. In the same way, the parts within the openings 42, 52 are removed, and an opening 62 is further formed. As shown in FIG. 7, at the same time as at least a top portion of the external terminal 30 is exposed, the openings 42, 52 and 62 are connected vertically and the cutting region 70 can be avoided. In the example described above, the openings 52 and 62 in the lowermost layer 50 and the uppermost layer 60 are formed separately, but alternatively these openings for avoiding the cutting region 70 may be formed at a time after the lowermost layer 50 and the uppermost layer 60 are both formed.

And, in this process, the uppermost layer 60 may be formed only around the bottom of the external terminal 30. That is, the cutting region 70 may be avoided by causing the openings 42, 52 to connect in the vertical direction. Differently from in the example described above, the uppermost layer 60 may be formed using an exposure technique, in the same way as the first resin layer 40.

And whereas, in the example described above, both the first resin layer 40 and the second resin layer 100 were formed avoiding the cutting region 70, the present embodiment is not limited to this. That is, when the Young's modulus of the material of the lowermost layer 50 and the uppermost layer 60 constituting the second resin layer 100 is lower than that of the first resin layer 40, the lowermost layer 50 and the uppermost layer 60 maybe formed so as to cover the cutting region 70. In particular, it is desirable for only the uppermost layer 60, which supports the bottom of the external terminal 30, to be provided so as to cover the cutting region 70 (see second embodiment). If the material of the second resin layer 100 covering the cutting region 70 is a material having a lower Young's modulus than the material of the first resin layer 40 and the other layers constituting the second resin layer 100 (the lowermost layer 50), the occurrence of cracking of the edges of the semiconductor element 12 arising when the aggregate 10 is diced, and its progress, can be reduced, and detachment of the first resin layer 40 and the second resin layer 100 from the semiconductor element 12 can be reduced.

Figure 8:
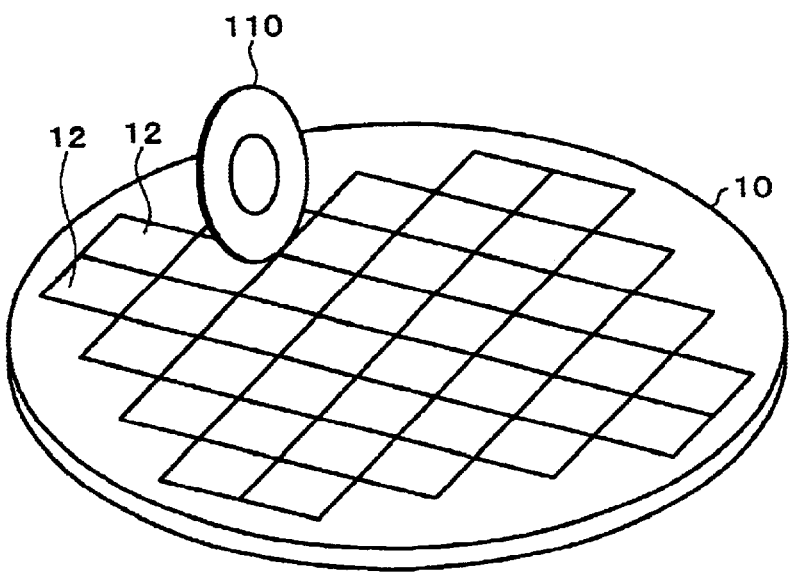
FIG. 8 is illustrative of a method of manufacturing a semiconductor device according to the first embodiment of the invention.

As shown in FIG. 7 and FIG. 8, the aggregate 10 is diced along the cutting region 70. That is, the aggregate of semiconductor devices including the aggregate 10 of multiple semiconductor elements 12 is diced to form a semiconductor device 1 for each of the semiconductor elements 12. FIG. 7 is a view showing a cross-section of the aggregate 10 being cut, and FIG. 8 is a view showing the aggregate 10 as a whole being cut.

The aggregate 10 is cut from the side on which the electrodes 14 are formed. For example, as shown in FIG. 7, a blade 110 is positioned on the cutting region 70, which at least the first resin layer 40 is formed to avoid. The aggregate 10 can then be cut by the blade 110 being rotated at high speed. In this case, the aggregate 10 may be affixed to tape (not shown) for cutting.

By this means, because cutting is carried out along the cutting region 70 which at least the first resin layer 40 is formed to avoid, cracking of the edges of the semiconductor device 1 caused by the cutting can be reduced. As a result, detachment of the first resin layer 40 and the second resin layer 100 of the semiconductor device 1 can be prevented. Accordingly, it is possible to manufacture a highly reliable semiconductor device.

Next, with reference to FIGS. 9 to 12, first to fourth variations of the method of manufacturing a semiconductor device according to this embodiment will be described below.

First Variation

Figure 9:
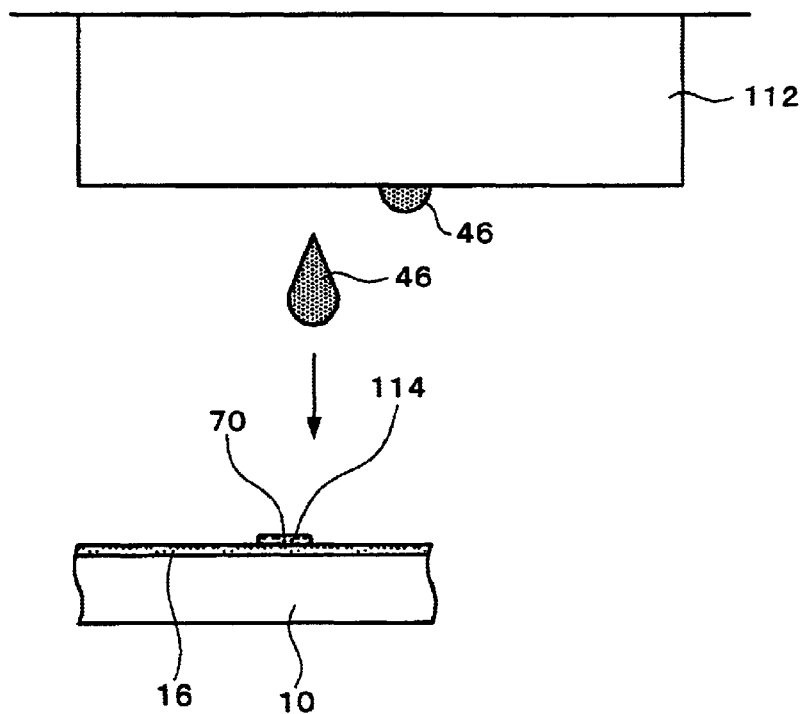
FIG. 9 is illustrative of a first variation of a method of manufacturing a semiconductor device according to the first embodiment of the invention.

In this variation, shown in FIG. 9, at least one resin layer (for example at least the first resin layer 40) formed avoiding the cutting region 70 is formed by an ink jet method. By this means, by a simple process, it is possible to provide the first resin layer 40 on a region where it is necessary, avoiding the cutting region 70. And, as well as avoiding the cutting region 70, the first resin layer 40 is provided avoiding the electrodes 14.

With the ink jet method, by applying technology used in ink jet printers, the ink can be rapidly and economically provided without wasting.

The ink jet head 112 shown in FIG. 9 is for example one used in an ink jet printer, and either a piezo jet type using a piezoelectric device or a bubble jet type using an electro-thermal convertor as an energy-generating device can be used. By this means it is possible to set freely the discharge area and discharge pattern of a paste 46 to become the first resin layer 40.

In this case, as shown in FIG. 9, a material 114 having a constituent which repels the paste 46 of the first resin layer 40 may be provided on the cutting region 70 for the formation of the first resin layer 40. The material 114 may for example be a fluorine-based compound. By this means it is possible to form the first resin layer 40 avoiding the cutting region 70 with certainty.

Second Variation

Figure 10:
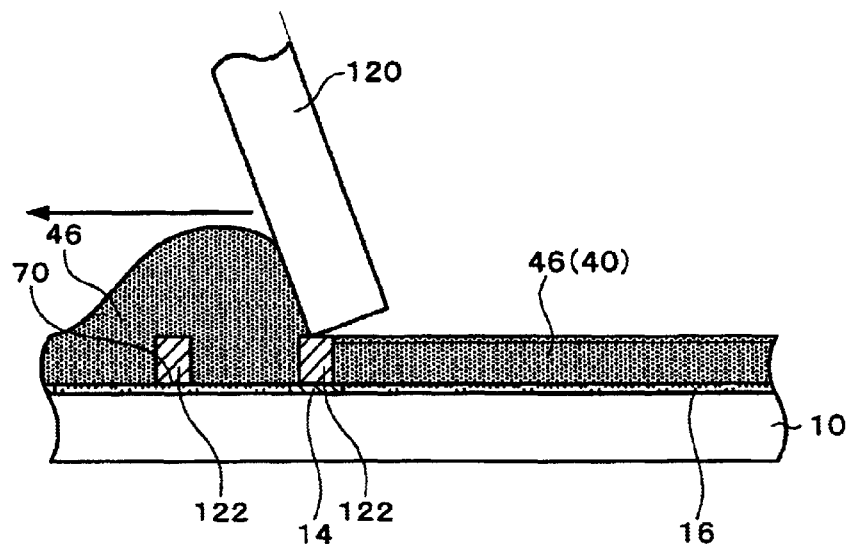
FIG. 10 is illustrative of a second variation of a method of manufacturing a semiconductor device according to the first embodiment of the invention.

As shown in FIG. 10, in this variation, at least one resin layer (for example at least the first resin layer 40) formed avoiding the cutting region 70 is formed by a printing method. By this means, it is possible to provide the first resin layer 40 on a region where it is necessary, avoiding the cutting region 70, with a simple process. And, as well as avoiding the cutting region 70, the first resin layer 40 is provided avoiding the electrodes 14.

For example, as shown in FIG. 10, the cutting region 70 and the electrodes 14 are covered with a mask 122. In other words, over regions other than the cutting region 70 and the electrodes 14 there are openings in the mask 122. Then, the paste 46 to be the material of the first resin layer 40 is provided over the entire surface of the aggregate 10, and the paste 46 is spread uniformly to the height of the mask 122 in the open regions of the mask 122. In this case, a squeegee 120 can be used to spread the paste 46 over the openings. After that, the mask 122 is removed to leave a first resin layer 40 formed in the regions where it is necessary, avoiding the cutting region 70 and the electrodes 14.

Third Variation

Figure 11:
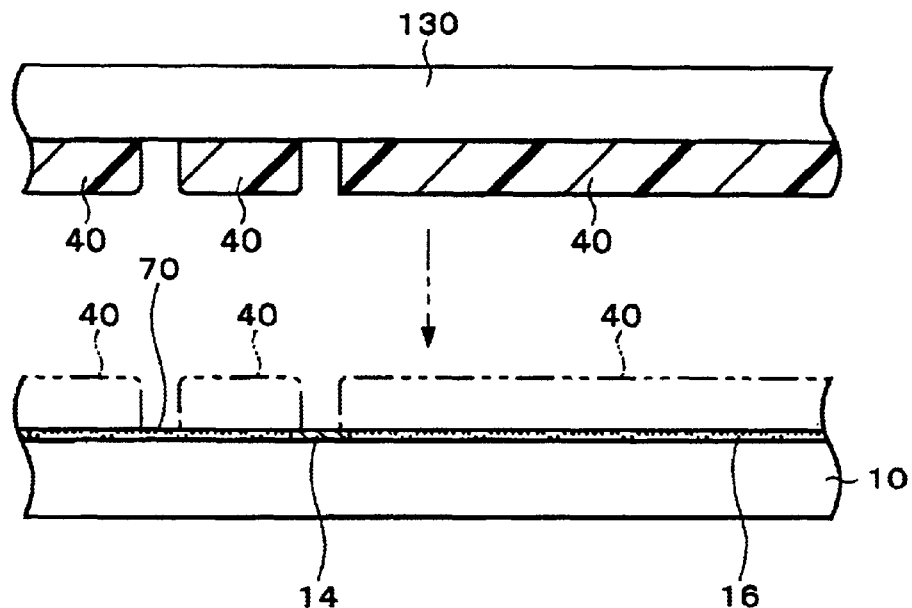
FIG. 11 is illustrative of a third variation of a method of manufacturing a semiconductor device according to the first embodiment of the invention.

As shown in FIG. 11, in this variation, at least one resin layer (for example at least the first resin layer 40) is formed in a region avoiding the cutting region 70 by first being formed on a separate member 130 by patterning and then transferred to the aggregate 10. By this means it is possible more simply to form the first resin layer 40 in a region avoiding the cutting region 70. And as well as avoiding the cutting region 70, the first resin layer 40 is provided avoiding the electrodes 14.

In this case, as shown in the example above, the first resin layer 40 may be excluded by providing the material 114. By this means it is possible to form the first resin layer 40 avoiding the cutting region 70 with certainty.

Fourth Variation

Figure 12:
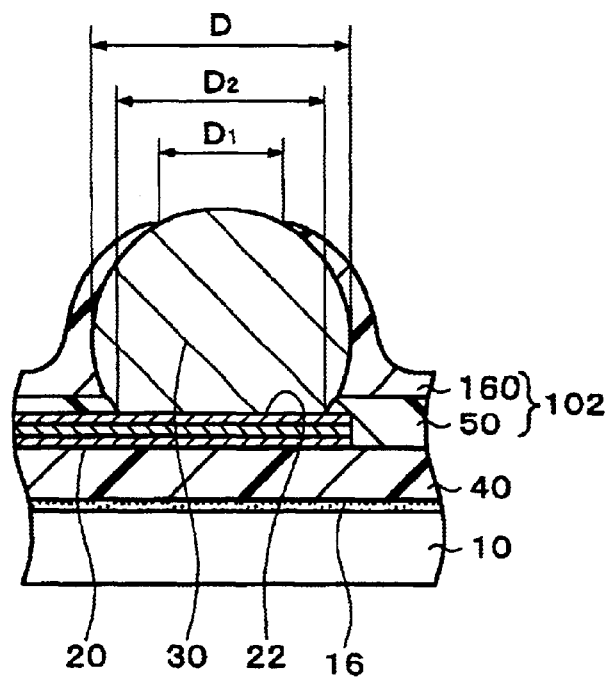
FIG. 12 is illustrative of a semiconductor device and a fourth variation of a method of manufacturing a semiconductor device according to the first embodiment of the invention.

FIG. 12 is a view showing the vicinity of the external terminal 30 of this variation. This variation is a variation of the semiconductor device of the embodiment. In this variation, the form of the part of a second resin layer 102 including an uppermost layer 160 provided around the external terminal 30 differs from that described above.

For example when the external terminal 30 is formed in the shape of a ball, the diameter $D_2$ of the contact section of the external terminal 30 connected to the land section 22 and the diameter D of the external terminal 30 are in the relationship:

$$D_2 \leq D$$

And the uppermost layer 160 is formed so that the diameter $D_2$ of the contact section and the diameter $D_1$ of the part of the external terminal 30 exposed from the uppermost layer 160 have the relationship:

$$D_1 < D_2$$

That is, within a limit such that the electrical connection between the external terminal 30 and the circuit board is not impaired, the uppermost layer 160 can be formed covering the outside of the external terminal 30. In this case, as shown in FIG. 12, the part of the uppermost layer 160 covering the external terminal 30 may protrude above the rest of the uppermost layer 160.

By this means, when the external terminal 30 is electrically connected to the circuit board, both of the electrical connections can be protected surely. Stresses acting on the part of the external terminal 30 joined to the interconnect 20 are relieved further, and the occurrence of cracking of the joint can be prevented. Thus, it is possible to provide a highly reliable semiconductor device. A method of manufacturing a semiconductor device according to this variation may be the same as that described above.

Second Embodiment

Figure 13:
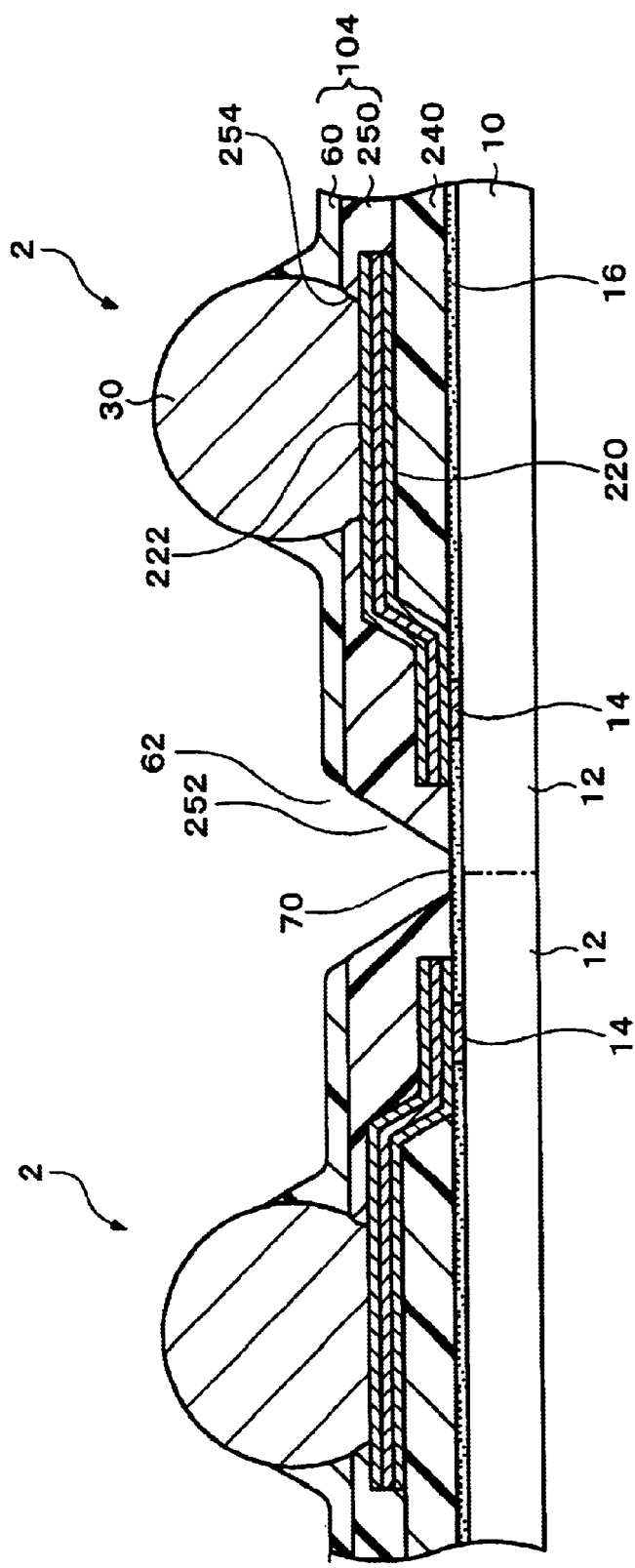
FIG. 13 is illustrative of a semiconductor device and a method of manufacturing a semiconductor device according to a second embodiment of the present invention.
Figure 14:
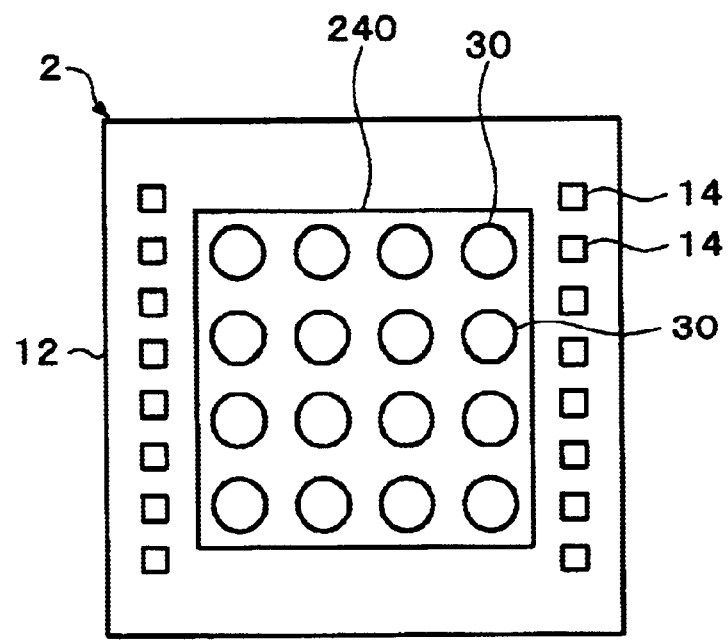
FIG. 14 is illustrative of a semiconductor device according to the second embodiment of the invention.
Figure 15:
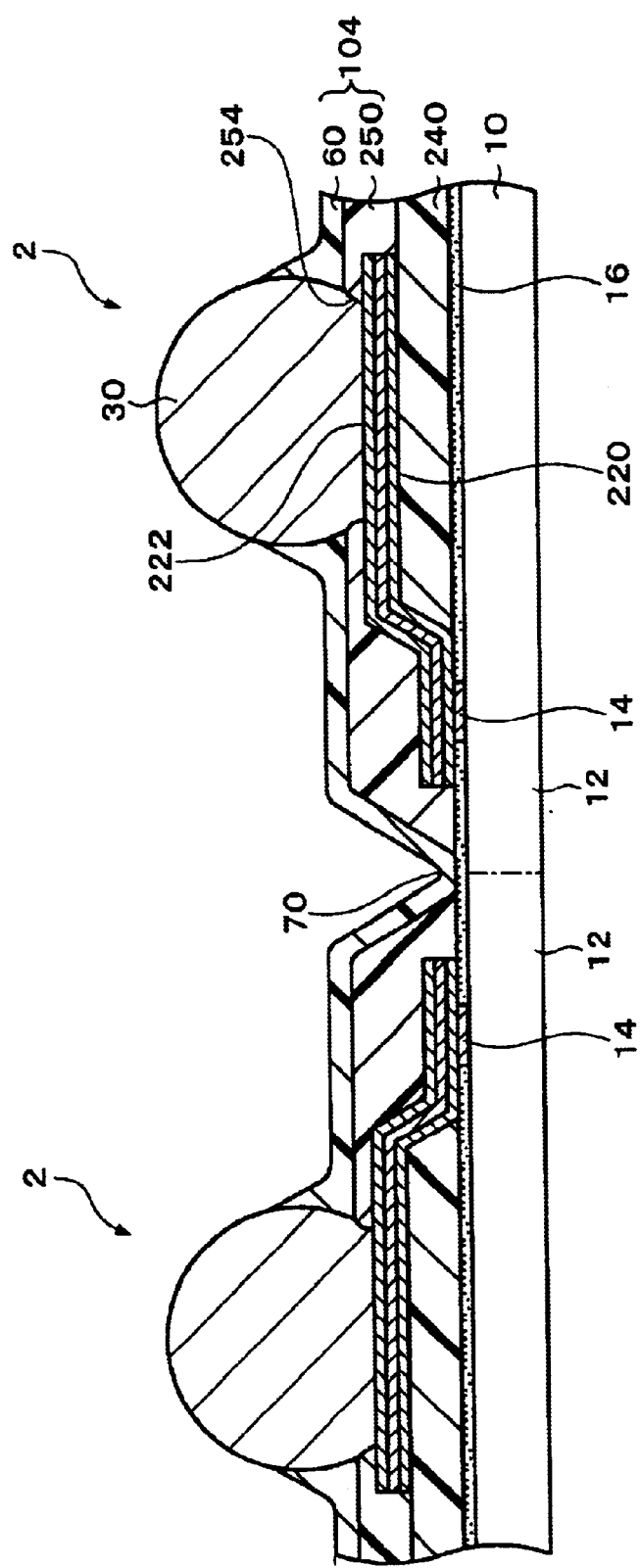
FIG. 15 is illustrative of a semiconductor device and a method of manufacturing a semiconductor device according to a variation of the second embodiment of the invention.

FIGS. 13 to 15 are views illustrating a semiconductor device and manufacturing method thereof according to this embodiment. FIG. 13 is a sectional view of an aggregate (semiconductor wafer) including semiconductor devices according to this embodiment. FIG. 14 is a plan view of a semiconductor device according to this embodiment, and specifically is a plan view of a semiconductor chip obtained by dicing the aggregate shown in FIG. 13. In FIG. 14, interconnects 220 and a second resin layer 104 are omitted. FIG. 15 is a sectional view of an aggregate (semiconductor wafer) including a semiconductor device according to a variation of this embodiment.

A semiconductor device according to this embodiment includes an individual semiconductor element (semiconductor chip) 12, interconnects 220, external terminals 30 and a plurality of resin layers (in FIG. 13, a first resin layer 240 and a second resin layer 104). At least one of the plurality of resin layers (in FIG. 13, all of the resin layers) is formed avoiding the edges of the semiconductor element 12. In this semiconductor device 2, the form of the first resin layer 240 differs from that in the first embodiment. And although the second resin layer 104 may be formed in a single layer, in the example shown in FIG. 13 it is made up of a plurality of layers, an uppermost layer 60 and a lowermost layer 250. The semiconductor device 2 is obtained by cutting apart the semiconductor devices shown in FIG. 13. Except for the following description, this semiconductor device may have the same form as in the first embodiment.

In the semiconductor element 12 of this embodiment, the electrodes 14 are formed at the edges. And the first resin layer 240 is formed in the middle of the semiconductor element 12. In other words, the first resin layer 240 is formed in a region on the semiconductor element 12 on the inner side of the electrodes 14. As shown in FIG. 14, when a plurality of electrodes 14 are lined up on each of two opposite sides of the semiconductor element (semiconductor chip) 12, the first resin layer 240 is formed in the region sandwiched between the electrodes 14 lined up at the sides. Or, when a plurality of electrodes 14 are lined up along all the sides (four sides) of the semiconductor element 12, the first resin layer 240 is formed in the region surrounded by the electrodes 14 lined up along the sides. The first resin layer 240 formed on the semiconductor element 12 may be integrated in one region, as shown in FIG. 14, or may be divided into a plurality of regions.

As a result, even if the thermal expansion coefficient of the first resin layer 240 is somewhat different from that of the semiconductor element 12, because the region of formation of the first resin layer 240 is kept small, stresses acting on the external terminal 30 can be relieved.

And, by forming the first resin layer 240 like this, it is possible to form the first resin layer 240 avoiding the cutting region 70. The interconnects 220 can be formed on the first resin layer 240 from the electrodes 14 in the same way as in the first embodiment.

The thermal expansion coefficient of the first resin layer 240 may be smaller than that of the second resin layer 104. By this means, it is possible to relieve thermal stresses acting on the external terminal 30.

In a semiconductor device according to this embodiment, the second resin layer 104 is formed to be positioned within an outline of the semiconductor element 12. Specifically, the second resin layer 104 is formed avoiding the edges of the semiconductor element 12. Otherwise it may be the same as in the first embodiment.

As shown in FIG. 15, as a variation of this embodiment, the uppermost layer 160 of the second resin layer 104 maybe formed so as to cover the edges of the semiconductor element 12. In particular, preferably the uppermost layer 60 is made of a material having a lower Young's modulus than the material of the first resin layer 240 and the other layers consisting of the second resin layer 104 (the lowermost layer 250). That is, of the plurality of resin layers, even if the uppermost layer 60 of the second resin layer 104 is formed reaching the edges of the semiconductor element 12, it is possible to effectively prevent cracking of the edges of the semiconductor element 12, reduce the progress of any such cracking, and prevent the resin layers from detaching from the edges of the semiconductor element 12.

A method of manufacturing a semiconductor device according to this embodiment will now be described.

After the first resin layer 240 is provided over the entire surface of the aggregate 10, including the electrodes 14, an exposure technique or the like is applied to form the first resin layer 240 into regions inside the electrodes 14 on each semiconductor element 12. By this means it is possible to form a first resin layer 240 avoiding the cutting region 70. After that, the interconnects 220 are formed from the electrodes 14 on the first resin layer 240 and as necessary a lowermost layer 250 is formed. By forming holes 254 in the lowermost layer 250 exposing land sections 222 of the interconnects 220, it is possible to provide external terminals 30 easily. The step of forming the lowermost layer 250 may be omitted.

The external terminals 30 and the uppermost layer 60 are formed in the same way as in the first embodiment, and openings 252, 62 are formed in the cutting region 70. Then, the aggregate 10 is cut up along the cutting region 70. By this means it is possible to reduce detachment of the plural resin layers of the semiconductor device.

Alternatively, after the uppermost layer 60 is provided over the entire surface of the aggregate 10, only the parts of the uppermost layer 60 covering the external terminals 30 may be removed. That is, the uppermost layer 60 may be left covering the cutting region 70 of the aggregate 10. By this means it is possible to form the uppermost layer 60 with a simple process.

In this embodiment also, the first to fourth variations of the embodiment described above can be applied to the manufacture of the semiconductor device.

Third Embodiment

Figure 16:
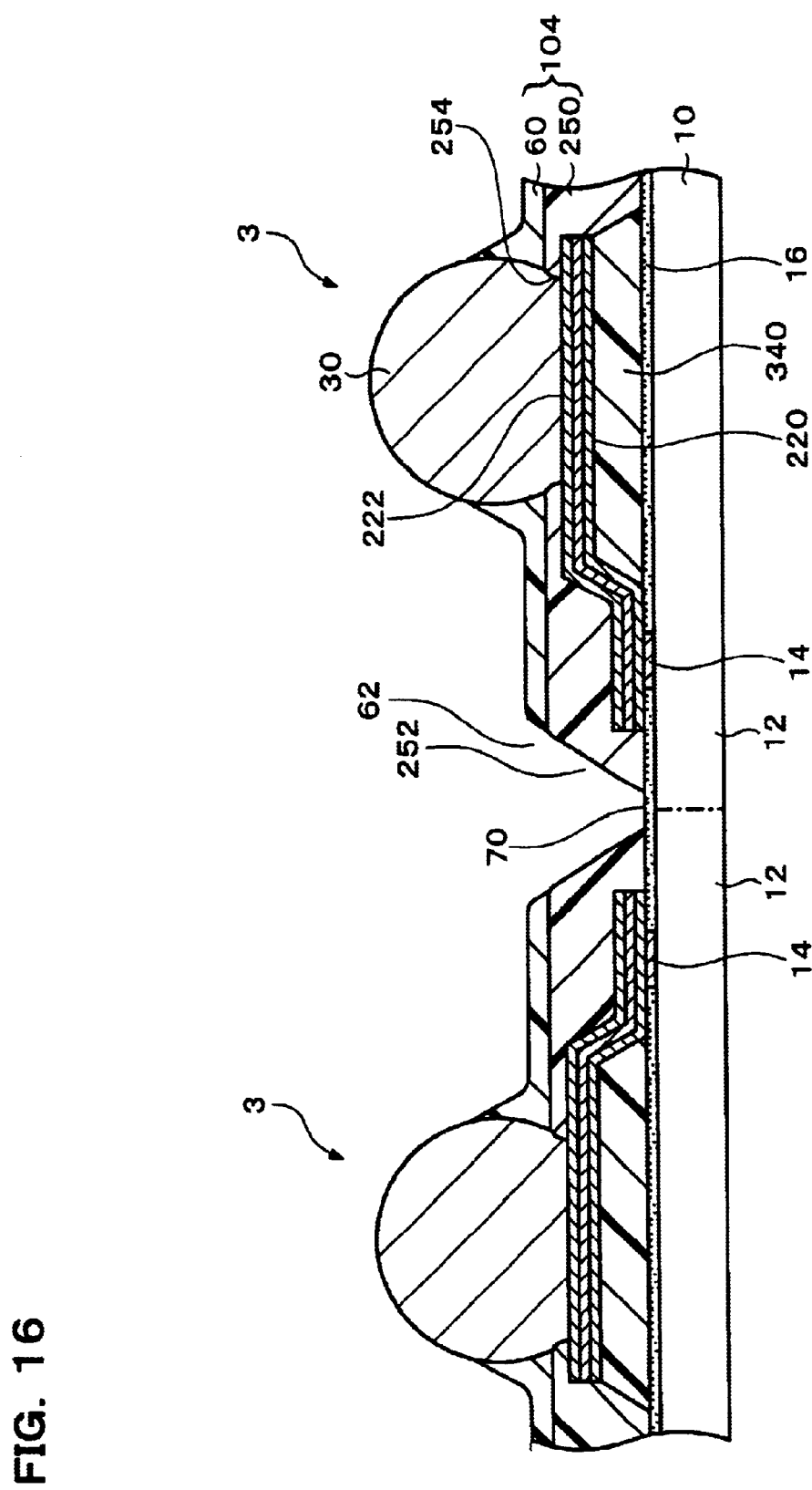
FIG. 16 is illustrative of a semiconductor device and a method of manufacturing a semiconductor device according to a third embodiment of the invention.
Figure 17:
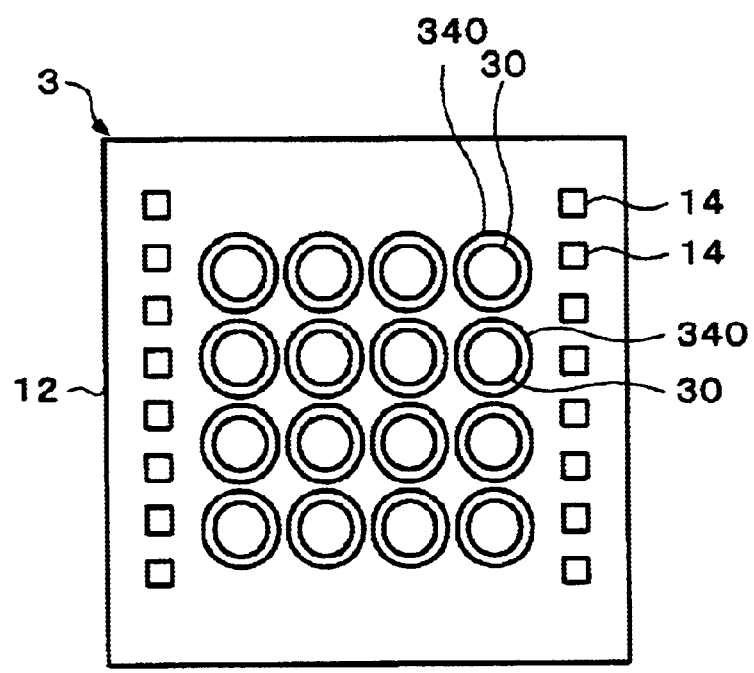
FIG. 17 is illustrative of a semiconductor device according to the third embodiment of the invention.
Figure 18:
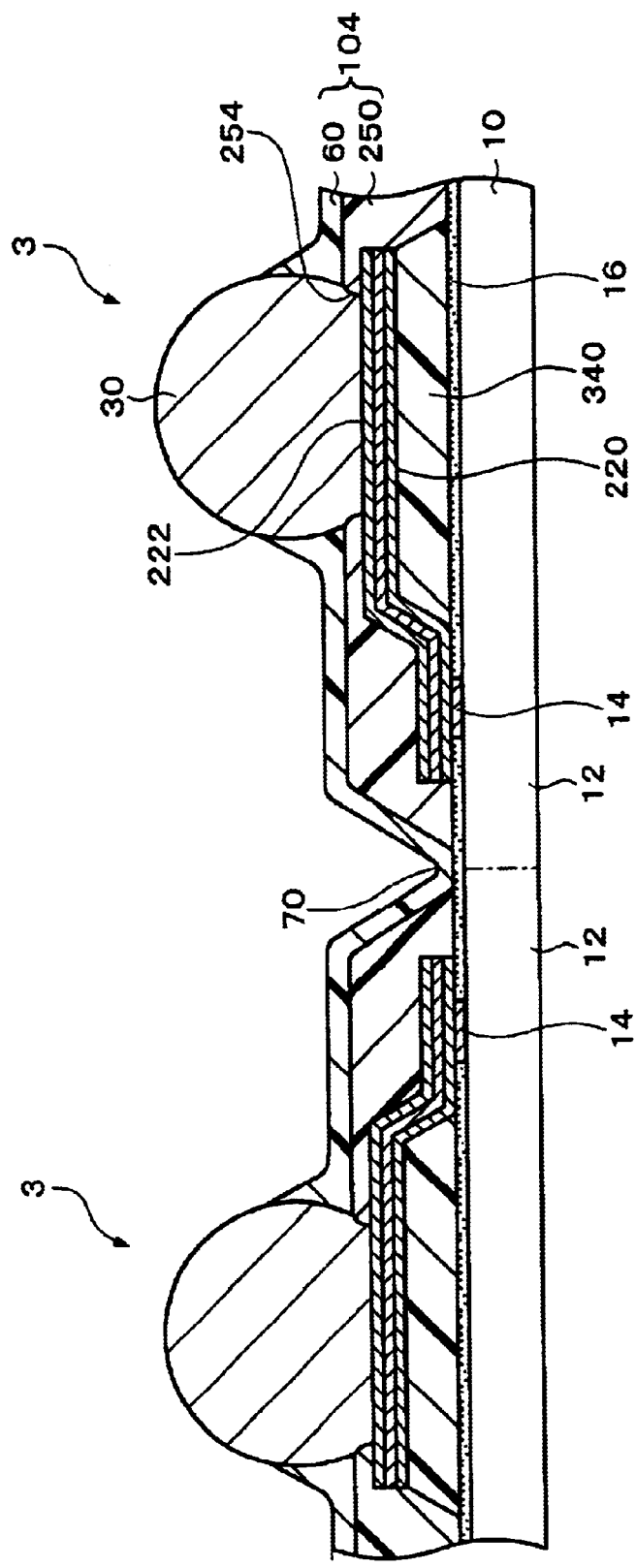
FIG. 18 is illustrative of a semiconductor device and a method of manufacturing a semiconductor device according to a variation of the third embodiment of the invention.

FIGS. 16 to 18 are views illustrating a semiconductor device and manufacturing method thereof according to this embodiment. FIG. 16 is a sectional view of an aggregate (semiconductor wafer) including semiconductor devices according to this embodiment. FIG. 17 is a plan view of a semiconductor device according to this embodiment, and specifically a plan view of a semiconductor chip obtained by dicing the aggregate shown in FIG. 16. In FIG. 16, interconnects 220 and the second resin layer 104 are omitted. FIG. 18 is a sectional view of an aggregate (semiconductor wafer) including semiconductor devices according to a variation of this embodiment.

A semiconductor device according to this embodiment includes an individual semiconductor element (semiconductor chip) 12, interconnects 220, external terminals 30 and a plurality of resin layers (in FIG. 16, a first resin layer 340 and a second resin layer 104). At least one of the plurality of resin layers (in FIG. 16, all of the resin layers) is formed avoiding the edges of the semiconductor element 12. In this semiconductor device 3, the form of a first resin layer 340 differs from that in the first embodiment. The semiconductor device 3 is illustrated by cutting apart the semiconductor devices as shown in FIG. 16. Except for the following description, this semiconductor device may have the same form as in the first and second embodiments.

The first resin layer 340 of this embodiment is formed only below the external terminals 30. Any first resin layer 340 is formed below each of the external terminals 30 formed on the semiconductor element 12. That is, the first resin layers 340 are so formed that they are the same in number as the number of external terminals 30.

As shown in FIG. 17, the outline of each first resin layer 340 in plane view of the semiconductor element 12 is formed larger than the outline of the external terminal 30. The outline of the first resin layer 340 may be circular or rectangular or the like.

By this means, because the region over which the first resin layer 340 is formed is kept small, even if the thermal expansion coefficient of the first resin layer 340 is somewhat different from that of the semiconductor element 12, stresses acting on the external terminal 30 can be relieved.

As shown in FIG. 18, as a variation of this embodiment, the uppermost layer 60 of the second resin layer 104 may be formed so as to cover the edges of the semiconductor element 12. In particular, preferably the uppermost layer 60 is made of a material having a lower Young's modulus than the material of the first resin layer 340 and the other layers consisting of the second resin layer 104 (the lowermost layer 250). That is, of the plurality of resin layers, even if the uppermost layer 60 of the second resin layer 104 is formed reaching the edges of the semiconductor element 12, it is possible to effectively prevent cracking of the edges of the semiconductor element 12, reduce the progress of any such cracking, and prevent the resin layers from detaching from the edges of the semiconductor element 12.

This semiconductor device can be manufactured by using the same method as in the second embodiment to form the first resin layers 340 only below the external terminals 30. In this embodiment also, the first to fourth variations of the embodiment described above can be applied to the manufacture of the semiconductor device.

Figure 19:
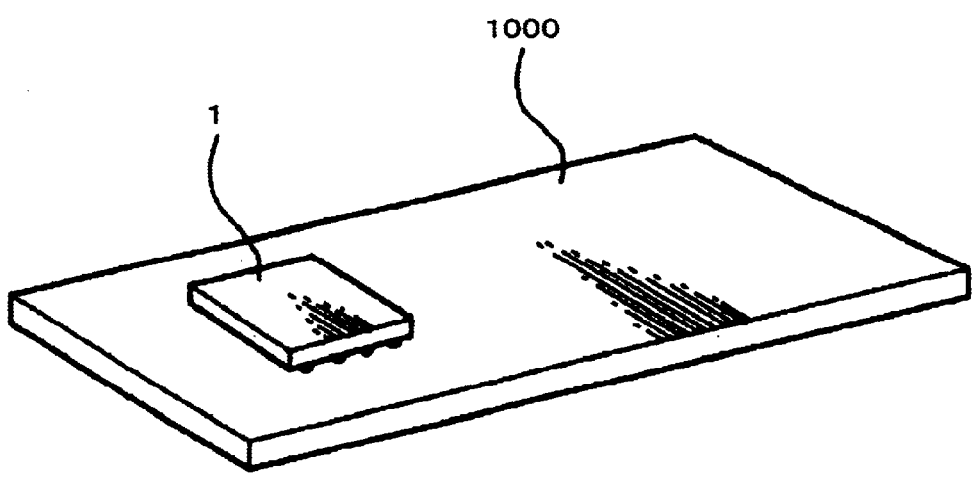
FIG. 19 shows a circuit board on which a semiconductor device according to the embodiments of the present invention is mounted.

FIG. 19 shows a circuit board 1000 on which is mounted a semiconductor device 1 according to the embodiments described above. For example an organic substrate such as a glass epoxy board is generally used for the circuit board 1000. For example interconnect patterns made of copper are formed on the circuit board 1000 so as to constitute a desired circuit, and these interconnect patterns are mechanically connected to the external terminals 30 of the semiconductor device 1 to achieve electrical continuity between the two.

Figure 20:
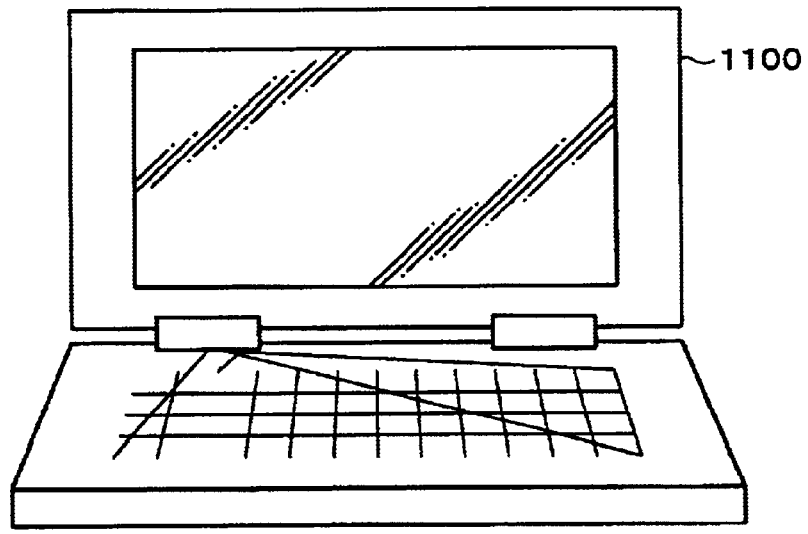
FIG. 20 shows an example of electronic equipment having a semiconductor device according to the embodiments of the present invention.
Figure 21:
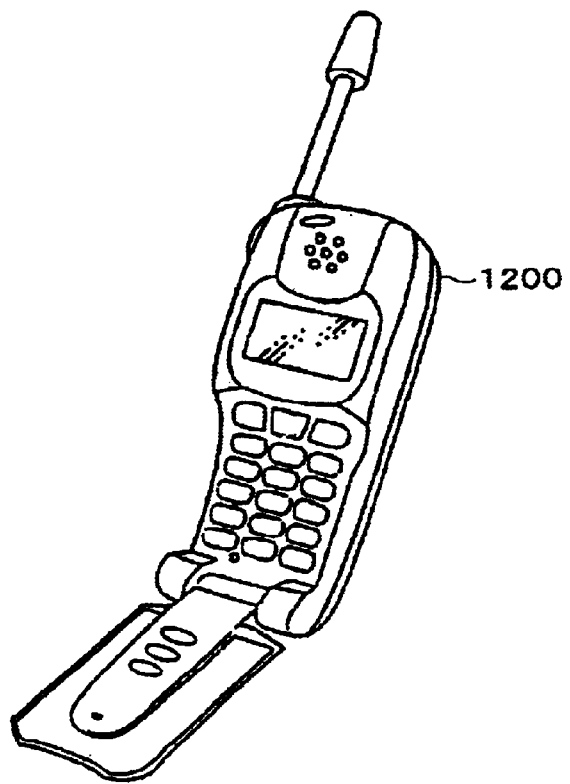
FIG. 21 shows another example of electronic equipment having a semiconductor device according to the embodiments of the present invention.

As examples of electrical equipment using a semiconductor device 1 to which the present invention has been applied, a notebook computer 1100 is shown in FIG. 20 and a mobile telephone 1200 is shown in FIG. 21.

What is claimed is:

1. A method of manufacturing a semiconductor device, the semiconductor device comprising a semiconductor chip having an electrode, an interconnect electrically connected to the electrode of the semiconductor chip, an external terminal electrically connected to the interconnect, and a plurality of resin layers provided on a surface of the semiconductor chip on which the electrode is formed, the plurality of resin layers include a first resin layer over which the interconnect extends and a second resin layer below which the interconnect extends, wherein the second resin layer does not extend to any planes parallel to side surfaces of the semiconductor chip, the planes including edges of the semiconductor chip, the method comprising the steps of:

forming the plurality of resin layers, an interconnect electrically connected to an electrode of each of a plurality of semiconductor elements, and an external terminal electrically connected to the interconnect, on an aggregate of semiconductor elements having an electrode; and cutting the aggregate, wherein at least one resin layer among the plurality of resin layers is formed avoiding a cutting region of the aggregate.

2. The method of manufacturing a semiconductor device as defined in claim 1, wherein the at least one resin layer is formed by an ink jet method or a printing method.

3. The method of manufacturing a semiconductor device as defined in claim 1, wherein the at least one resin layer is formed by transferring a previously formed pattern to the aggregate.

4. The method of manufacturing a semiconductor device as defined in claim 1, wherein a material having a component which repels the at least one resin layer is provided to the cutting region of the aggregate in order to form the at least one resin layer by repelling.

5. The method of manufacturing a semiconductor device as defined in claim 1, wherein the at least one resin layer is formed of a light-sensitive material; and wherein the at least one resin layer is formed by removing part of the at least one resin layer disposed over the cutting region of the aggregate, by exposure.

6. The method of manufacturing a semiconductor device as defined in claim 1, wherein the plurality of resin layers include a first resin layer below the interconnect and a second resin layer above the interconnect; and wherein at least the first resin layer is formed avoiding the cutting region of the aggregate, in the step of forming the resin layers.

7. The method of manufacturing a semiconductor device as defined in claim 6, wherein the second resin layer is formed avoiding the cutting region of the aggregate, in the step of forming the resin layers.

8. The method of manufacturing a semiconductor device as defined in claim 7, wherein at least an uppermost layer in the second resin layer is provided to cover the external terminal and the cutting region of the aggregate; and wherein part of the uppermost layer disposed over the cutting region of the aggregate is removed to expose at least a top portion of the external terminal, in the step of forming the resin layers.

9. The method of manufacturing a semiconductor device as defined in claim 6, wherein the second resin layer is formed of a plurality of layers; and wherein at least the uppermost layer in the second resin layer is formed to cover the cutting region of the aggregate, in the step of forming the resin layers.

10. The method of manufacturing a semiconductor device as defined in claim 1, wherein the plurality of resin layers include a first resin layer below the interconnect and a second resin layer above the interconnect; and wherein at least the second resin layer is formed avoiding the cutting region of the aggregate, in the step of forming the resin layers.

11. The method of manufacturing a semiconductor device as defined in claim 6, wherein the thermal expansion coefficient of the second resin layer is larger than the thermal expansion coefficient of the first resin layer.

12. The method of manufacturing a semiconductor device as defined in claim 6, wherein the second resin layer is formed such that part of the external terminal exposed from the second resin layer is smaller than a contact portion of the external terminal connected to the interconnect, in the step of forming the resin layers.

13. The method of manufacturing a semiconductor device as defined in claim 6, wherein the second resin layer is formed of a plurality of layers;

wherein the lowermost layer in the second resin layer is formed avoiding part of the interconnect in which the external terminal is formed, in the step of forming the resin layers; and wherein the external terminal is formed on part of the interconnect exposed from the second resin layer, in the step of forming the external terminal.

14. The method of manufacturing a semiconductor device as defined in claim 6, wherein each of the semiconductor elements is provided with a plurality of electrodes; and wherein the first resin layer is formed on each of the semiconductor elements on the inside of the electrodes, in the step of forming the resin layers.

15. A semiconductor device manufactured by the method as defined in claim 1.

16. A semiconductor device comprising:

a semiconductor chip having an electrode;

an interconnect electrically connected to the electrode of the semiconductor chip;

an external terminal electrically connected to the interconnect; and a plurality of resin layers provided on a surface of the semiconductor chip on which the electrode is formed, the plurality of resin layers include a first resin layer over which the interconnect extends and a second resin layer below which the interconnect extends, wherein the second resin layer does not extend to any planes parallel to side surfaces of the semiconductor chip, the planes including edges of the semiconductor chip.

17. The semiconductor device as defined in claim 16, wherein the semiconductor chip has a plurality of electrodes, the electrodes formed closer to edges of the semiconductor chip than at least one resin layer among the plurality of the resin layers.

18. The semiconductor device as defined in claim 16, wherein the plurality of resin layers include a resin layer provided on the interconnect to cover a bottom periphery of the external terminal; and wherein part of the external terminal exposed from the resin layer is smaller than another part of the external terminal connected to the interconnect.

19. A circuit board over which is mounted the semiconductor device as defined in claim 16.

20. Electronic equipment comprising the semiconductor device as defined in claim 16.

* * * * *